(12) United States Patent
Han

(10) Patent No.: US 7,494,195 B2
(45) Date of Patent: Feb. 24, 2009

(54) ELECTRONIC DEVICE ENCLOSURE

(75) Inventor: Shao-Bo Han, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 367 days.

(21) Appl. No.: 11/284,651

(22) Filed: Nov. 22, 2005

(65) Prior Publication Data

US 2006/0113103 A1 Jun. 1, 2006

(30) Foreign Application Priority Data

Nov. 26, 2004 (CN) .................... 2004 2 0102008 U

(51) Int. Cl.
*H02G 3/08* (2006.01)
(52) U.S. Cl. .................... 312/223.2; 312/328
(58) Field of Classification Search ............. 312/223.2, 312/223.1, 325–329, 323; 16/366, 289; 361/683; 220/817, 345.1; 174/50
See application file for complete search history.

(56) References Cited

U.S. PATENT DOCUMENTS

| 2,587,200 | A | * | 2/1952 | Nottingham | 217/60 C |
| 3,297,151 | A | * | 1/1967 | Palson | 206/45.23 |
| 3,526,008 | A | * | 9/1970 | Pruim | 5/430 |
| 4,736,332 | A | * | 4/1988 | Crease | 361/681 |
| 4,909,579 | A | * | 3/1990 | Liu | 312/223.2 |
| 4,960,256 | A | * | 10/1990 | Chihara et al. | 248/286.1 |
| 5,212,628 | A | * | 5/1993 | Bradbury | 361/683 |
| 5,339,494 | A | * | 8/1994 | Esau et al. | 16/294 |
| 5,495,389 | A | * | 2/1996 | Dewitt et al. | 361/683 |
| 5,590,022 | A | * | 12/1996 | Harvey | 361/683 |
| 5,626,406 | A | * | 5/1997 | Schmid | 312/334.28 |
| 5,761,034 | A | * | 6/1998 | Chu | 361/687 |
| 6,111,754 | A | * | 8/2000 | Abbott et al. | 361/724 |
| 6,388,876 | B1 | * | 5/2002 | Chen | 361/685 |
| 6,442,801 | B1 | * | 9/2002 | Kim | 16/361 |
| 6,643,896 | B2 | * | 11/2003 | Carrier | 16/242 |
| 6,665,178 | B2 | * | 12/2003 | Curlee et al. | 361/687 |
| 6,764,146 | B2 | | 7/2004 | Chen | |
| 6,819,551 | B2 | * | 11/2004 | Chen | 361/683 |
| 7,042,721 | B2 | * | 5/2006 | Olesiewicz et al. | 361/695 |
| 7,257,827 | B2 | * | 8/2007 | Lee | 720/653 |
| 2003/0147224 | A1 | * | 8/2003 | Chen | 361/752 |
| 2003/0151332 | A1 | * | 8/2003 | Chen | 312/223.2 |
| 2003/0151334 | A1 | * | 8/2003 | Chen et al. | 312/223.2 |
| 2006/0279184 | A1 | * | 12/2006 | Chen et al. | 312/223.2 |

FOREIGN PATENT DOCUMENTS

TW 539147 6/2003

* cited by examiner

*Primary Examiner*—Janet M Wilkens

(57) ABSTRACT

An electronic device enclosure includes a base (20), a bracket (10) pivotally connected with the base; and a pair of connecting pieces (30) pivotally attached to the bracket. The base forms a pair of projections (213). The connecting pieces each defines a guideway (35) corresponding to the projections for guiding rotation of the bracket with respect to the base, and a retaining hole (353) engaging with the projections for suspending the bracket over the base.

10 Claims, 3 Drawing Sheets

ELECTRONIC DEVICE ENCLOSURE

BACKGROUND OF THE INVENTION

1. Field of the Invention

The present invention relates to an electronic device enclosure, and more particularly to an electronic device enclosure which facilitates assembling.

2. General Background

An electronic device, such as computer or server, requires regular maintenance for sure of working well. To facilitate maintenance of the electronic device, an enclosure of the electronic device is often designed to be quickly and easily opened for access components received in the enclosure. Taiwan Patent No. 539147 discloses a computer enclosure which includes a hood, a base and a pair of connecting mechanisms. Each connecting mechanism includes a first lever having opposite ends pivotally connected with the hood and the base respectively, and a second lever having opposite ends pivotally connected with the first lever and the base respectively. The hood is swung apart from the base by means of the connecting mechanisms. However, each connecting mechanism requires at least two levers, it is unduly laborious and time-consuming to assemble the connecting mechanism with the hood and the base.

What is desired, therefore, is an electronic device enclosure which is easily assembled.

SUMMARY

In one preferred embodiment, an electronic device enclosure includes a base; a bracket pivotally connected with the base, the bracket being rotatable around a fixed axis between a first position at which the bracket is generally received in the base, and a second position at which the bracket is generally suspended over the base; and a pair of connecting pieces holding the bracket at the second position.

Other advantages and novel features will become more apparent from the following detailed description of preferred embodiments when taken in conjunction with the accompanying drawings, in which:

DETAILED DESCRIPTION OF THE EMBODIMENTS

Figure 1:
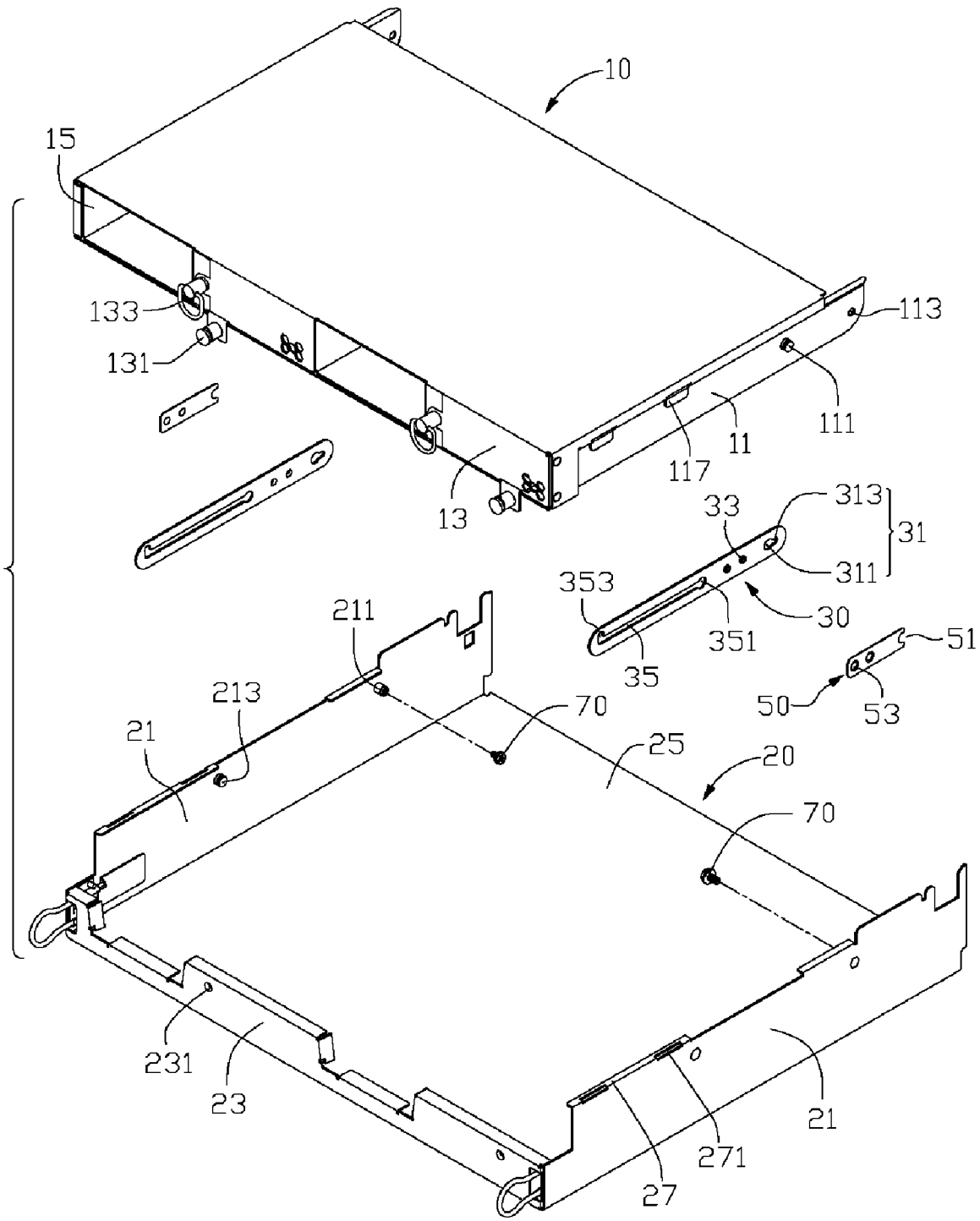
FIG. 1 is an exploded, isometric view of an electronic device enclosure in accordance with a preferred embodiment of the present invention, the electronic device enclosure including a bracket and a base.

Referring to FIG. 1, an electronic device enclosure includes a base 20, a bracket 10 which is rotatably received in the base 20, and a pair of connecting pieces 30 connecting the base 20 with the bracket 10.

The bracket 10 includes a pair of opposite parallel sidewalls 11 and a front wall 13 connected between front ends of the sidewalls 11. A pivot hole 113 is defined in a rear end of each sidewall 11. A pair of spaced tabs 117 depends from adjacent a top edge of each sidewall 11. A protrusion 111 is arranged at front of the pivot hole 113. A pair of spaced openings 15 is defined in the front wall 13, and electronic components such as hard disc drives received in the bracket 10 can be accessed via the openings 15. A pair of rings 133 is arranged on the front wall 13 adjacent the openings 15 respectively, for facilitating manipulating the bracket 10. A pair of spring screws 131 depends from the front wall 13.

The base 20 includes a bottom panel 25, a pair of side panels 21 extending perpendicularly upward from opposite side edges of the bottom panel 25, and a front panel 23 extending perpendicularly upward from a front edge of the bottom panel 25. The front panel 23 is lower than the side panels 21 in height. A pivot 211 is arranged on an inner side of each side panel 21, and a projection 213 is projected inwardly from the inner side of each side panel 21. A flange 27 is bent inward from a top edge of each side panel 21, and a pair of slots 271 is defined in the flange 27 corresponding to the tabs 117 of each sidewall 11. A pair of fasteners 70 such as screws is provided corresponding to the pivots 211. A pair of fixing holes 231 is defined in the front panel 23 corresponding to the spring screws 131 of the bracket 10.

Each connecting piece 30 is generally an elongate strip. Each connecting piece 30 defines an aperture 31 in a distal end thereof, corresponding to the protrusions 111, the aperture 31 includes an entrance portion 311 and a pivot portion 313 in communication with the entrance portion 311, the entrance portion 311 is dimensioned to allow a corresponding protrusion 111 extending therethrough, and the pivot portion 313 is dimensioned to prevent the corresponding protrusion 111 existing theretfrom. A pair of rivets 33 is formed on each connecting piece 30 adjacent the aperture 31. An elongate guideway 35 is defined in each connecting piece 30 corresponding to the projections 213, an entrance hole 351 is defined in communication with a first end of the guideway 35 adjacent the rivets 33, and a retaining hole 353 is defined in a proximal end of the connecting piece 30 in communication with a second end of the guideway 35. The retaining hole 353 is generally perpendicular to the guideway 35. The guideway 35 and the retaining hole 353 are dimensioned to prevent corresponding projection 213 from withdrawing therefrom.

A pair of fixing plates 50 is provided to attach the connecting pieces 30 to the bracket 10. Each fixing plate 50 defines a notch 51 in a distal first end thereof, corresponding to the pivot portion 313 of the aperture 31 of each connecting piece 30, and a pair of rivet holes 53 in a second end thereof, for receiving the rivets 33 of each connecting piece 30.

In assembly, the bracket 10 is rotatably attached to the base 20 via the pivots 211 of the side panels 21 extending through corresponding pivot holes 113 of the bracket 10, and the fasteners 70 are engaged in the pivots 211 for preventing the pivots 211 from withdrawing from the pivot holes 113.

Each fixing plate 50 is attached to corresponding connecting piece 30 with the rivets 33 engaging the rivet holes 53, the notch 51 of each fixing plate 50 overlaps the pivot portion 313 of the aperture 31 of the corresponding connecting piece 30, and the first end of the fixing plate 50 covers the entrance portion 311 of the aperture 31. Each assembled connecting piece 30 and fixing plate 50 is attached to corresponding side panel 21 of the base 20 by means of the projection 213 extending through the entrance hole 351 and relatively sliding in the guideway 35, the distal end of the connecting piece 30 is pressed toward the protrusion 111 of corresponding sidewall 11 of the bracket 10, the protrusion 111 extends through the entrance portion 311 of the aperture 31 of the connecting piece 30 and pushes the first end of the fixing plate 50 outwardly, the bracket 10 is rotated outwardly until the protrusion 111 enters the pivot portion 313 of the aperture 31, the fixing plate 50 is restored to cover the entrance portion 311, and the notch 51 engages the protrusion 111 to attach the assembled connecting piece 30 and fixing plate 50 to the bracket 10. Alternatively, each connecting piece 30 can be pivotally attached to corresponding side panel 21 of the base 20 directly via other fixing means such as screws.

Figure 2:
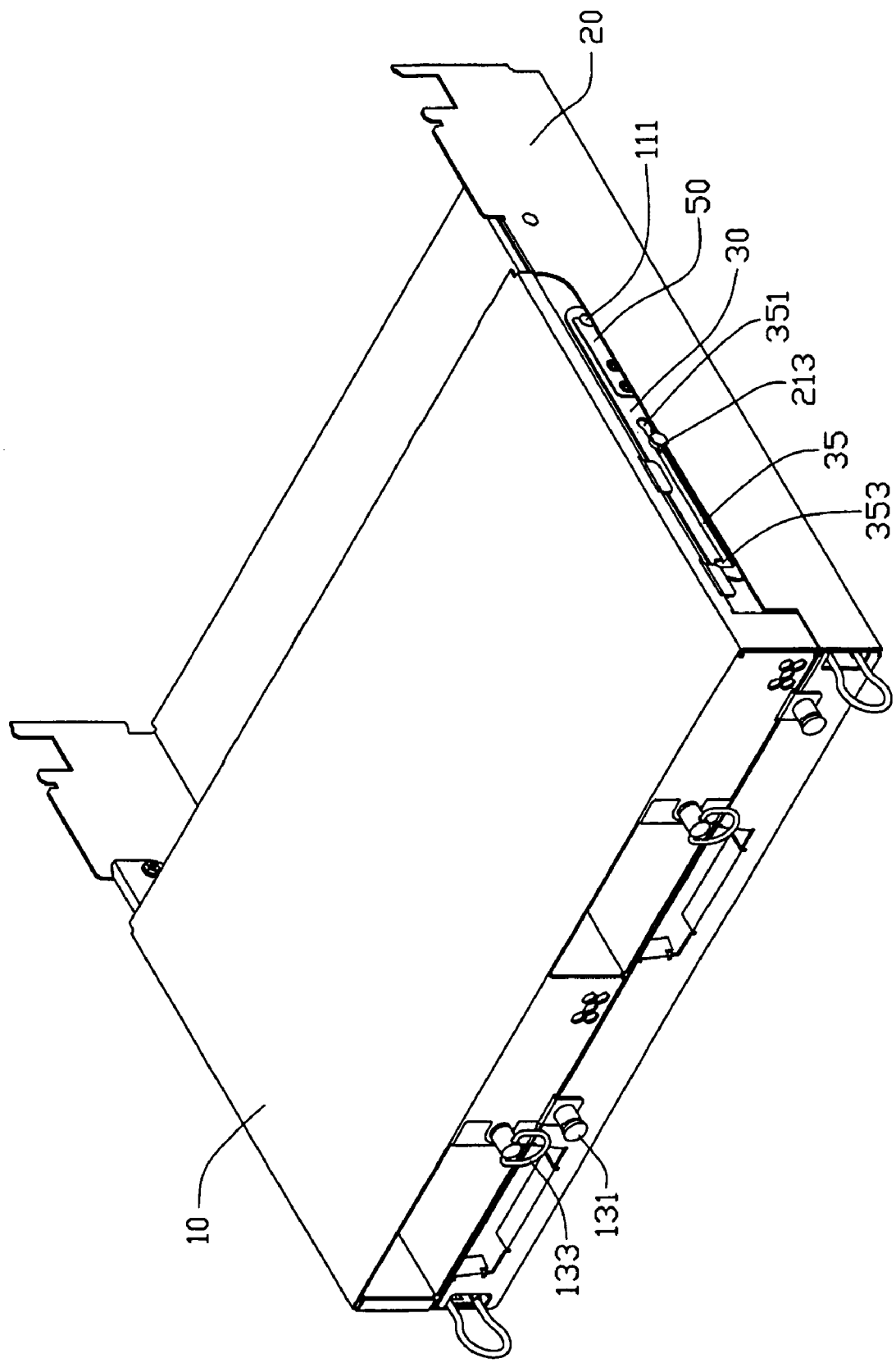
FIG. 2 is an assembled view of FIG. 1, showing the bracket is at a first position with respect to the base, the base having a portion thereof cut away.
Figure 3:
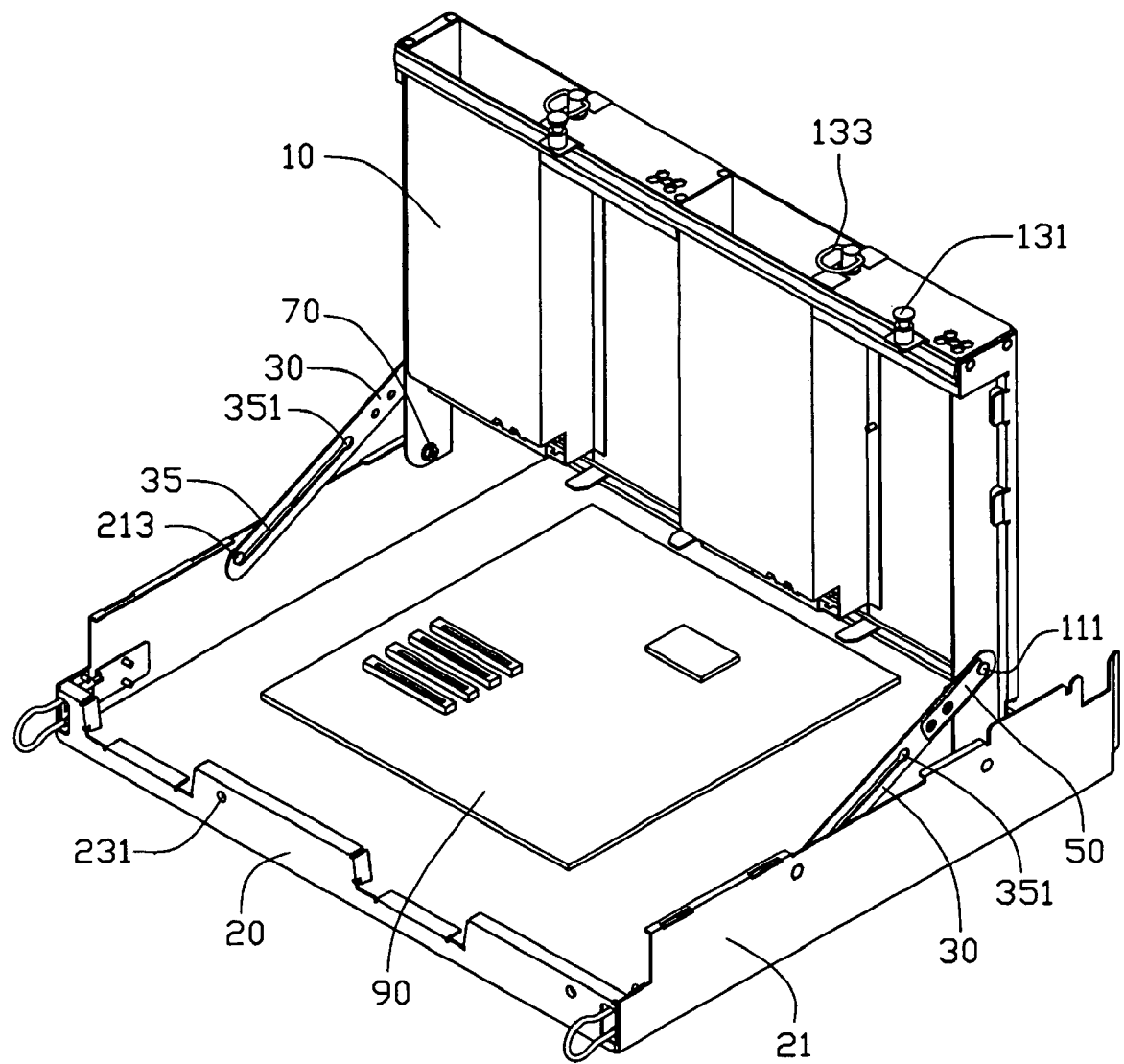
FIG. 3 is an assembled view of FIG. 1, showing the bracket is at a second position with respect to the base.

In use, FIG. 2 shows the bracket 10 is fixed to the base 20. The bracket 10 is generally accommodated in the base 20 with the protrusions 111 of the bracket 10 and the pivots 211 and the projections 213 of the base 20 being substantially in alignment with one another, and a plurality of components 90 including, for example, motherboard, hard disc drives, etc. is fixed on the bottom panel 25 under the bracket 10. The tabs 117 of the bracket 10 are engaged in the slots 271 of the base 20 respectively. The spring screws 131 of the bracket 10 are engaged in the fixing holes 231 of the front panel 23 of the base 20.

To maintain the components 90 under the bracket 10, the spring screws 131 are disengaged from the front panel 23 of the base 20, the bracket 10 is rotated outwardly from inside the base 20 by the rings 133. The bracket 10 is rotated around a first fixed axis defined by the pivots 211 of the base 20. The connecting pieces 30 are stretched slantingly outwardly, and the projections 213 of the base 20 are relatively slid along the guideways 35 of the connecting pieces 30 respectively, until the projections 213 engage in the retaining holes 353 of the connecting pieces 30 respectively such that the bracket 10 is suspended over the base 20, while the distal ends of the connecting pieces 30 are rotated around a second fixed axis formed by the protrusions 111 of the bracket 10. The protrusions 111 of the bracket 10, and the pivots 211 and the projections 213 of the base 20 together form a triangular shape during the bracket 10 being rotating away from the base 20 around the first fixed axis. The components 90 in the base 20 are exposed to facilitate servicing thereof.

To close the bracket 10, the connecting pieces 30 are pulled by the proximal ends thereof to disengage the projections 213 from the retaining holes 353 of the connecting pieces 30 respectively. The bracket 10 is then rotated back toward the base 20 until the front wall 13 of the bracket 10 seats on the front panel 23 of the base 20. The tabs 117 of the bracket 10 are engaged in the slots 271 of the base 20 respectively. The spring screws 131 of the bracket 10 are engaged in the fixing holes 231 of the front panel 23 to fix the bracket 10 to the base 20.

As an alternative embodiment, the connecting pieces 30 can be reversely connected to the bracket 10 and the base 20. That is, the apertures 31 of the connecting pieces 30 are respectively engaged with the projections 213 of the base 20 respectively, and the guideways 35 of the connecting pieces 30 engage with the protrusions 111 of the bracket 10 respectively.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. An electronic device enclosure, comprising:
    a base;
    a bracket pivotally connected to the base, the bracket being rotatable around a first fixed axis between a first position at which the bracket is generally received in the base, and a second position at which the bracket is generally suspended over the base; and
    a pair of connecting pieces each having one end pivotably connected to the bracket around a second fixed axis spaced from the first fixed axis, and an opposite end rotatably and slidably attached to the base;
    wherein the base comprises a pair of side panels, and the bracket comprises a pair of sidewalls corresponding to the side panels respectively,
    the base further comprises a front panel connecting between the side panels, the front panel is lower than the side panels in height, and the bracket further comprises a front wall capable of seating on the front panel of the base.

2. The electronic device enclosure as claimed in claim 1, wherein the connecting pieces each defines a retaining hole in one end thereof and pivotally connects at the other end thereof with one of the base and the bracket, the other of the base and bracket forms a pair of projections engaging in the retaining holes respectively of the connecting pieces to hold the bracket at the second position.

3. The electronic device enclosure as claimed in claim 2, wherein the connecting pieces each further defines a guideway in communication with the retaining hole.

4. The electronic device enclosure as claimed in claim 1, wherein each of the side panels of the base forms a pivot forming the first fixed axis thereon, and each of the sidewalls of the bracket defines a pivot hole engaging with the pivot of corresponding side panel.

5. The electronic device enclosure as claimed in claim 1, wherein a fixing hole is defined in the front panel of the base, and a screw is provided to engage in the fixing hole to fix the bracket to the base.

6. An electronic device enclosure, comprising:
    a base;
    a bracket rotatably connected to the base around a first axis between a first position at which the bracket is generally received in the base, and a second position at which the bracket is generally suspended over the base; and
    a connecting piece with one end thereof pivotally attached to one of the base and the bracket around a second axis, the connecting piece defining a guideway, a projection formed on the other of the base and the bracket being slidably and rotatably received in the guideway, thereby guiding rotation of the bracket with respect to the base, the first and second axes and the projection being substantially in alignment with one another when the bracket is rotated to the base, the first and second axes and the projection being in a triangular shape when the bracket is rotated away from the base, the connecting piece capable of suspending the bracket over the base;
    wherein the base comprises a pair of opposite panels, and the bracket comprises a pair of opposite walls corresponding to the panels respectively,
    an aperture is defined in said end of the connecting piece, and a protrusion forming the second axis is formed on one of the walls of the bracket pivotally engaging in the aperture.

7. The electronic device enclosure as claimed in claim 6, wherein the projection is formed on one of the panels, a retaining hole is defined in the connecting piece capable of engaging with the projection to suspend the bracket over the base.

8. The electronic device enclosure as claimed in claim 7, wherein the retaining hole is generally perpendicular to the guideway, and the retaining hole is in communication with the guideway.

9. The electronic device enclosure as claimed in claim 6, wherein the aperture comprises an enlarged entrance portion allowing the protrusion extending therethrough and a narrow pivot portion engaging with the protrusion, and a fixing plate is provided to prevent the protrusion from entering the entrance portion from the pivot portion.

10. The electronic device enclosure as claimed in claim 6, wherein a tab is formed adjacent one of the walls of the bracket, and a flange is formed from a top edge of one of the panels of the base, and a slot is defined in the flange engaging with the tab.

* * * * *